(12) United States Patent
Chang

(10) Patent No.: US 8,662,879 B2
(45) Date of Patent: Mar. 4, 2014

(54) MICRO/NANO IMPRINT MOLD OF THE FABRICATING PROCESS

(75) Inventor: Fuh-Yu Chang, Taipei (TW)

(73) Assignee: National Taiwan University of Science and Technology (TW)

(*) Notice: Subject to any disclaimer, the term of this patent is extended or adjusted under 35 U.S.C. 154(b) by 309 days.

(21) Appl. No.: 13/115,319

(22) Filed: May 25, 2011

(65) Prior Publication Data

US 2012/0126447 A1    May 24, 2012

(30) Foreign Application Priority Data

Nov. 18, 2010   (TW) ............................... 99139717 A

(51) Int. Cl.
*B29C 59/02*    (2006.01)

(52) U.S. Cl.
USPC ............................ 425/385; 425/403; 425/406

(58) Field of Classification Search
USPC ........................................ 425/385, 403, 406
See application file for complete search history.

(56) References Cited

U.S. PATENT DOCUMENTS

| 8,163,222 B2* | 4/2012 | Done et al. ..................... 264/293 |
| 2006/0177535 A1* | 8/2006 | McMackin et al. ........... 425/385 |
| 2007/0126150 A1* | 6/2007 | GanapathiSubramanian et al. ............................. 264/319 |
| 2008/0131822 A1* | 6/2008 | Liao et al. ...................... 430/347 |
| 2010/0120251 A1* | 5/2010 | Sreenivasan et al. ......... 438/694 |

FOREIGN PATENT DOCUMENTS

| JP | 2006269919 A | 10/2006 |
| JP | 2010131923 A | 6/2010 |
| TW | 200736846 B | 3/2006 |
| TW | I271777 B | 1/2007 |
| TW | I310116 A | 1/2008 |
| TW | 201000394 A | 1/2010 |
| TW | 1329791 B | 9/2010 |

* cited by examiner

*Primary Examiner* — James Sanders
(74) *Attorney, Agent, or Firm* — Patterson & Sheridan, LLP

(57) ABSTRACT

The invention discloses a mold performing in the micro/nano imprint fabricating process, wherein the mold is utilized to imprint a pattern on a substrate via a material layer. The mold comprises an upper surface, a lower surface, a pre-determined structure and an overflow controlling device. The upper surface and the lower surface are corresponded to each other. The pre-determined structure is disposed on the lower surface of the mold. The overflow controlling device is utilized to maintain the pressure among the material layer and the substrate.

5 Claims, 6 Drawing Sheets

MICRO/NANO IMPRINT MOLD OF THE FABRICATING PROCESS

CROSS-REFERENCE TO RELATED APPLICATION

This application claims priority based on Taiwanese Patent Application No. 099139717, filed on Nov. 18, 2010, the disclosure of which is incorporated herein by reference in its entirety.

BACKGROUND OF THE INVENTION

1. Field of the Invention

The present invention relates to a micro/nano imprint mold of the fabricating process and the method of fabricating etching barrier pattern or anti-etch structure with high aspect ratio by utilizing thereof. More particularly, the present invention relates to a mold and the method thereof which are used to improve the accuracy of fabricated pattern and the pressure distribution among the substrate.

2. Description of the Prior Art

Light-emitting diode (LED) wafers will become epitaxial wafers by a fabricating process. The epitaxial wafers fabricating process comprises a MOCVD process. The growth of the materials is horizontally stacked, the defection rate of the lattice is low and the luminous rate of the light is high. To enhance the quality of the epitaxial layers, a designed pattern with high aspect ratio convex structure shall be formed on the substrate before the MOCVD process for producing the stacked epitaxial layers with less crystal dislocation and defect.

In the traditional semiconductor fabricating process, the mainstream is the lithography etching process. The lithography etching process is used to expose the photoresist coated on the substrate by the optical mask for forming the photoresist layer with a pre-determined shape to cover the substrate. Then, the substrate will be placed in an erosive gas or liquid. The parts of the substrate, which are not covered by the photoresist, will be etched and form a notch structure. When the erosion develops to a certain level, the photoresist layer can be removed by the solvent and form the convex structure.

However, the lithography etching process has the following disadvantages. (1) The photoresist with high resolution is expensive. The price of photoresist can be reach hundreds of thousands of US Dollars per liter so that the cost of the lithography etching process is high in prior art. Additionally, because the less selection of the material, it is difficult to meet the need of the different etching process. For example, the anti-etching ability of the photoresist of the PMMA is poor. (2) The lithography etching process uses an aligner exposure machine to expose all substrate or a stepping exposure machine to expose the small area of the substrate. Using the aligner exposure machine to expose all substrate is fast, but the resolution of the lithography etching process is limited (line width shall be larger than 2 μm). Using the stepping exposure machine to expose the small area of the substrate can fabricate the structure with small line width. So that the photoresist with low anti-etching ability and thin-film thickness shall be used, the etching structure with high aspect ratio is difficult to fabricate. (3) The anti-etching ability of the photoresist is limited, particularly the photoresist which is used in the lithography process with high resolution. Because the ability of the anti-etching ability is poor, the yield is low when the micro/nano structure with thinner line width is fabricated in the lithography etching process.

Accordingly, the micro/nano imprint fabricating process is developed. The micro/nano imprint fabricating process is used to imprint the substrate directly so that the expected pattern can be imprinted directly. However, when the flatness error of the substrate cannot be accepted, the micro/nano imprint fabricating process cannot imprint the pattern on the substrate smoothly and unevenly. Thus, the yield will be decreased.

Furthermore, in traditional micro/nano imprint fabricating process, the structure of the sticky and flexible material will become highly different because of the uneven pressure. Please refer to FIG. 1. FIG. 1 illustrates a perspective view of the non-uniformity of fabricated structures according to the prior art. As shown in FIG. 1, the peripheral of the material layer will lower than the height of the central material layer because the pressure applied to the material layer by the center of the mold is larger than the pressure applied by the peripheral of the mold. Thus, the phenomenon will affect the quality of the fabricating process.

Therefore, it is necessary to provide a micro/nano imprint mold of the fabricating process which is used to improve the flatness with large errors and the uneven pressure among the substrate.

SUMMARY OF THE INVENTION

Accordingly, a scope of the invention is to provide a micro/nano imprint mold of the fabricating process. The mold can be fabricated with a uniform micro/nano convex structure at relatively low cost for LED.

According to an embodiment, a scope of the invention is to provide a micro/nano imprint mold of the fabricating process. The mold used to imprint a pattern to a substrate by a material layer, comprises an upper surface, a pre-determined structure and an overflow controlling device. In practice, the overflow controlling device is disposed on the external edge of the mold and extends outward. Furthermore, the height of the overflow controlling device is equal to or slightly lower than the pre-determined structure of the mold.

Additionally, in practice, the mold further comprises at least one pressure controlling structure. The pressure controlling structure is disposed on the upper surface of the mold in order to increase the horizontal height of the external edge of the mold. The pressure controlling structure is a hollow ring. Furthermore, the central thicknesses of the plurality of the pressure controlling structures are thinner than the plurality of the pressure controlling structures which are on the edge. The mold can be a flexible mold. Additionally, the mold can further comprise a notch structure which is disposed on the lower surface of the mold.

Furthermore, another scope of the invention is to provide the method for fabricating an etching barrier pattern or anti-etching structure with high aspect ratio by using micro/nano imprint fabricating process. The method of the invention comprises the following steps of: (S1) coating a material layer with a substrate, (S2) forcing a pressure to form an etching barrier pattern or anti-etching structure by using a mold with a pre-determined structure, wherein the mold can be a flexible mold, and (S3) etching the substrate to form a convex structure.

In practice, the aspect ratios of the pre-determined structure, anti-etching structure and convex structure are equal to or larger than three. Additionally, the material layer can be a material which can avoid etching well, such as spin on glass, Hydrogen Silsesquioxane, polymer composite materials which are added with carbon nanotubes or silica micro/nano particles. Furthermore, the substrate is a sapphire substrate.

Accordingly, the invention does not use the lithography fabricating process, so the photoresist is not used. A material can be used if the anti-etching of the material is better than the photoresist, so that the disadvantages of the anti-etching ability can be improved in a sapphire etching process and save cost. Additionally, the invention uses a machining process, so that the resolution does not be affected by the wavelength of the beam. According to the design of the invention, the structure which is on a substrate can be large scale or small scale. At the same time, the micro structure for the lateral epitaxial wafer and the micro/nano structure for anti-reflecting can be fabricated on the substrate.

Furthermore, the invention is to provide a structural design micro/nano imprint mold, for controlling the distribution of the forming pressure. Additionally, the invention can improve the yield rate of the pattern, fabricated with the linewidth under one micron, in the LED fabricating process, while the flatness difference of full-field is very large. The distribution of the pressure can also be improved to increase the yield rate and the efficiency in the fabricating process.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
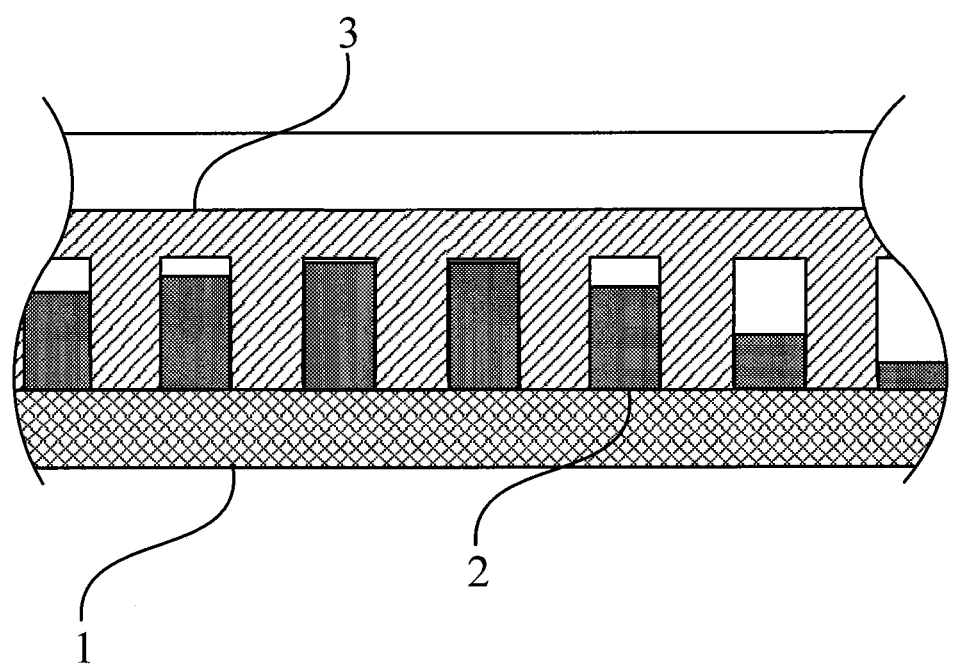
FIG. 1 illustrates a perspective view of the non-uniformity of fabricated structures according to the prior art.
Figure 2:
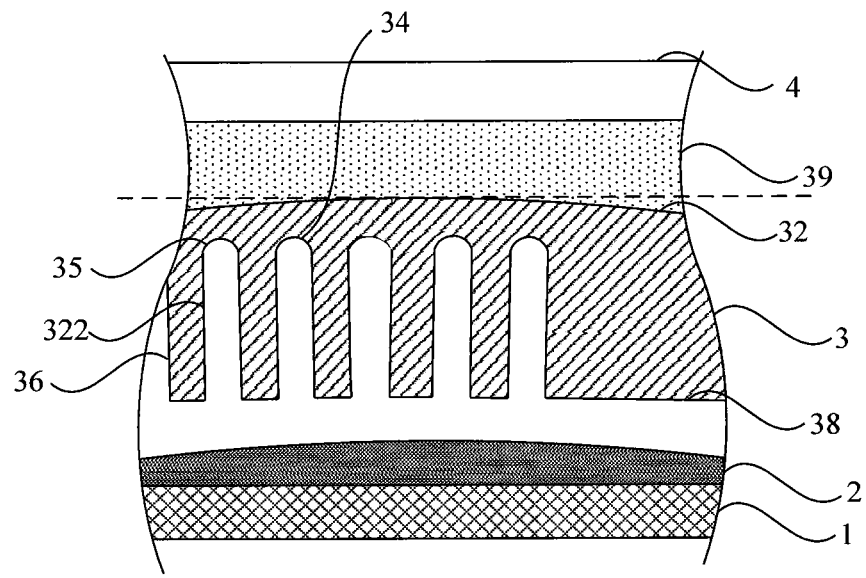
FIG. 2 illustrates a schematic diagram of the micro/nano imprint mold of the fabricating process according to an embodiment of the invention.

Please refer to FIG. 2. FIG. 2 illustrates a schematic diagram of the micro/nano imprint mold of the fabricating process according to an embodiment of the invention. The invention is to provide a mold 3 for the micro/nano imprint fabricating process for imprinting a pattern to a substrate 1 by a material layer 2. The mold 3 comprises an upper surface 32, a lower surface 34, a pre-determined structure 36 and an overflow controlling device 38. The upper surface 32 is corresponded to the lower surface 34. The pre-determined structure 36 is disposed on the lower surface 34 of the mold 3. The overflow controlling device 38 is used to maintain the pressure of the material layer 2 between the mold 3 and the substrate 1. Furthermore, the upper surface 32 of the mold 3 faces a pressing plate 4. The pressing plate 4 is connected to a power source to drive and provide energy to the mold 3.

In the embodiment, the substrate 1 is made of sapphire for fabricating the light emitting diode (LED). The material also can be semiconductor materials, metals, glass, or polymer composite materials as the fabricating process needs. In the preferred embodiment, the material layer 2 is a spin on glass sol gel. However, the material layer 2 is not limited to the spin on glass. The material layer 2 also can be chosen from the material with better ability of anti-etching, such as polymer composite materials which are added with carbon nanotubes, metal particles or glass particles. Furthermore, the polymer composite materials are not necessary to have the characteristic of photoresist in the embodiment.

The mold 3 comprises the upper surface 32 and the lower surface 34. The upper surface 32 and the lower surface 34 are corresponded to each other. The lower surface 34 is a surface of the mold 3 which faces the substrate 1. Accordingly, the upper surface 32 is a surface of the mold 3 which is opposite to the lower surface 34 correspondingly. Additionally, the pre-determined structure 36 is disposed on the lower surface of the mold 3 and extends outward from the lower surface 34. The pre-determined structure 36 has at least one groove 322 for accommodating the material layer 2 to form an anti-etching structure 22 which is corresponded to the pattern of the pre-determined structure 36. The width of the groove 322 can range from micrometer to nanometer. In the embodiment, the pre-determined structure 36 is a structure with high aspect ratio. The aspect ratio is equal to or larger than three. That is to say, the height of the pre-determined structure 36 shall be at least three times larger than the width of pre-determined structure 36. Furthermore, for a given fabricating process and selection of the material of the substrate 1, the mold 3 is capable of having the pre-determined structure 36 imprint the material layer 2 which is contacted with the substrate 1.

Please refer to FIG. 2. The micro/nano imprint mold 3 of the invention further comprises the overflow controlling device 38. In the embodiment, the overflow controlling device 38 is disposed on the external edge of the mold 3 and extends outward. The external edge of the mold 3 means the peripheral part which is around the center of the mold 3. Additionally, the overflow controlling device 38 can be used to maintain the pressure in the mold 3 to enhance the energy when the material layer 2 flows outward. Thus, the material layer 2 is prevented from flowing outward because of heat and pressure. Furthermore, enhancing the energy can decrease the speed of the material layer 2 when the material layer 2 is flowing outward. So the invention can avoid the height of the anti-etching structure 22 to be uneven in prior art. Accordingly, the height of the overflow controlling device 38 is equal to or slightly lower than the height of the pre-determined structure 36 of the mold 3.

In prior art, the pressure applied to the material layer 2 by the center of the mold 3 is larger than the pressure applied by the peripheral of the mold 3. The higher pressure can provide more filling force, so the peripheral of the material layer 2 will be lower than the height of the central material layer 2. Thus, the phenomenon will affect the quality of the fabricating process. The problem is obvious when making the structure with high aspect ratio. Accordingly, the mold 3 can further comprise at least one pressure controlling structure 39. The pressure controlling structure 39 is disposed on the upper surface 32 of the mold 3 in order to increase the horizontal height of the external edge of the mold 3. In addition, the larger pressure can be applied to the mold 3 by the pressing plate 4.

Figure 3A:
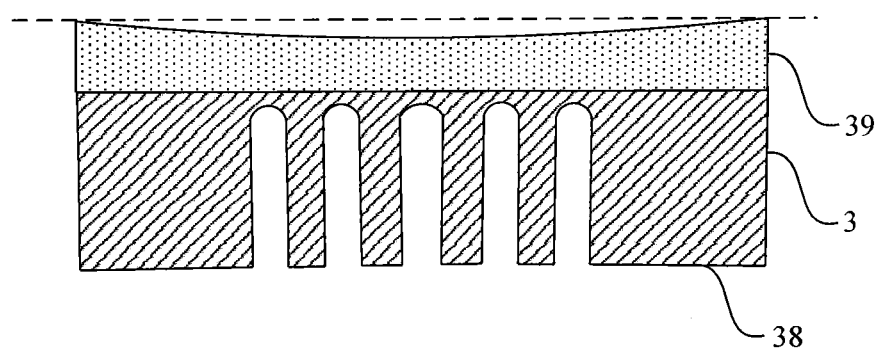
FIG. 3A illustrates a schematic diagram of the pressure controlling structures according to an embodiment of the invention.

Please refer to FIG. 3A. FIG. 3A illustrates a schematic diagram of the pressure controlling structures according to an embodiment of the invention. In the embodiment, the shape of the pressure controlling structure 39 is relative to the mold 3. Furthermore, the thickness of the central pressure controlling structure 39 is thinner than the peripheral of the pressure controlling structure 39. In the embodiment, the pressure controlling structure 39 has flaky texture which is related to the shape of the mold 3. The central pressure controlling structure 39 is thinner than the external edge of the pressure controlling structure 39 in order to increase the horizontal height of the external edge of the mold 3. Thus, the horizontal height of the external edge of the mold 3 is higher than the center of the mold 3. Accordingly, the mold 3 can apply larger pressure to the external edge of the substrate 1 in order to prevent the material layer 2 from flowing outward and prevent the height of the anti-etching structure 22 from being uneven.

Figure 3B:
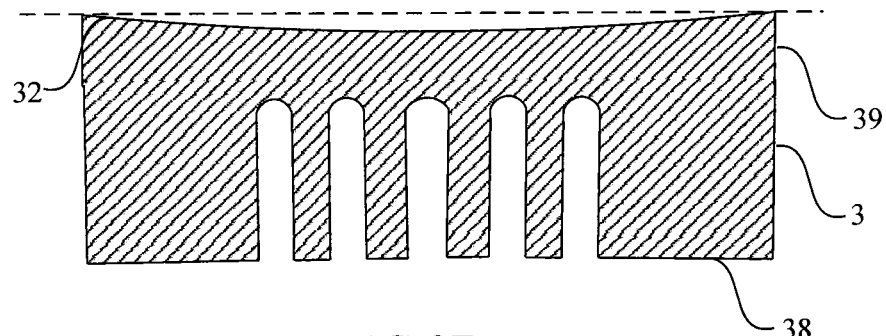
FIG. 3B illustrates a schematic diagram of the pressure controlling structures integrated with the mold according to another embodiment of the invention.
Figure 3C:
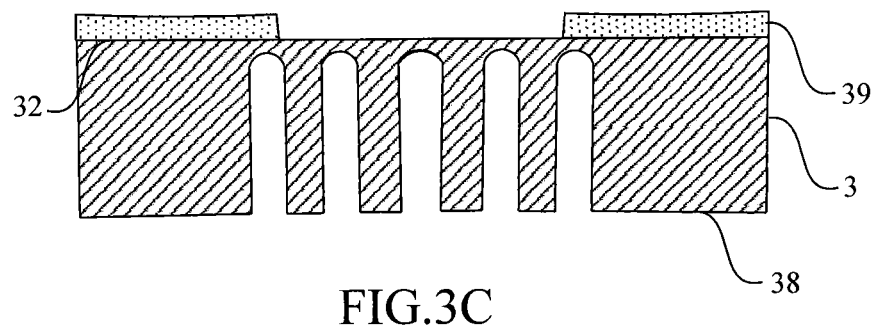
FIG. 3C illustrates a schematic diagram of a ring type pressure controlling structure integrated with the mold according to another embodiment of the invention.
Figure 3D:
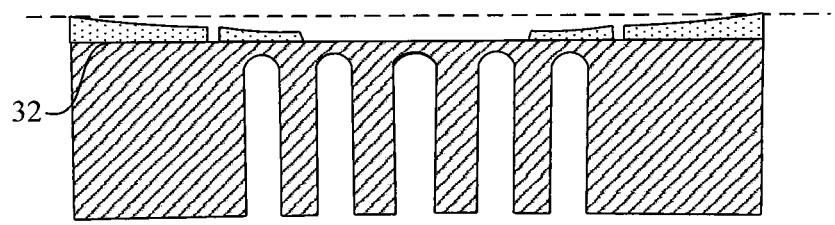
FIG. 3D illustrates a schematic diagram of a plurality of ring type pressure controlling structures integrated with the mold according to another embodiment of the invention.

Please refer to FIG. 3B. FIG. 3B illustrates a schematic diagram of the pressure controlling structures integrated with the mold according to another embodiment of the invention. In the embodiment, the pressure controlling structure 39 is integrated with the upper surface 32 of the mold 3 in order to form a surface with high gradient. Please refer to FIG. 3C and FIG. 3D, FIG. 3C illustrates a schematic diagram of a ring type pressure controlling structure integrated with the mold according to another embodiment of the invention. FIG. 3D illustrates a schematic diagram of a plurality of ring type pressure controlling structures integrated with the mold according to another embodiment of the invention. As shown in figures, the pressure controlling structure 39 can be a plurality of rings which are disposed on the upper surface 32 of the mold 3. Additionally, according to the design of the pressing plate 4, the pressures applied to each part of the surface of the mold 3 can be controlled by applying different pressures separately or in turn. Furthermore, the external edge of the mold 3 contacted with the substrate 1 can be disposed with a pressure threshold responsive element. If the pressure in the material layer 2 is too large, the pressure can be released appropriately to prevent the pre-determined structure 36 from breaking in the mold 3.

In the embodiment, the mold 3 can be a flexible mold. When the mold 3 is applied with a pressure and transformed in the anti-etching structure fabricating process, the mold 3 can be joined with the substrate 1 to solve the problem that the flatness of the substrate 1 is too low. The thickness of the flexible mold can be changed by using different materials, such as the anti-etching structure 22 so that the pressure applied to the mold 3 can be changed. Accordingly, the flatness problem and the thickness problem caused by the sapphire wafers or LED structures can be solved in the exposure developing fabricating process. In the prior art, the depth of the exposure development is shallow if the exposure developing structure is too small. For example, if the flatness of the wafer is poor, the yield will be decreased in the fabricating process. The invention is to provide the mold 3 and the forming way of micro/nano imprint and the flatness of the substrate can be accepted with high tolerance. The high-resolution or small anti-etching structure can be fabricated by the mold 3.

Please refer to FIG. 2. The air between the material layer 2 and the mold 3 does not be released when the anti-etching structure 22 with high aspect ratio is fabricated. If the gas does not be released, the gas will exist in the material layer 2. Additionally, the material layer 2 applied with a pressure flows outward, so that the yield will be decreased. In the embodiment, the mold 3 can further comprise a notch structure 35 disposed on the lower surface 34 of the mold 3, for accommodating the air and avoiding the air to be released between the material layer 2 and the mold 3. The notch structure 35 can also accommodate the air released from the pressing material layer 2. Furthermore, the notch structure 35 can improve the yield of a method for fabricating an anti-etching structure with high aspect ratio by using micro/nano imprint fabricating process.

Figure 4:
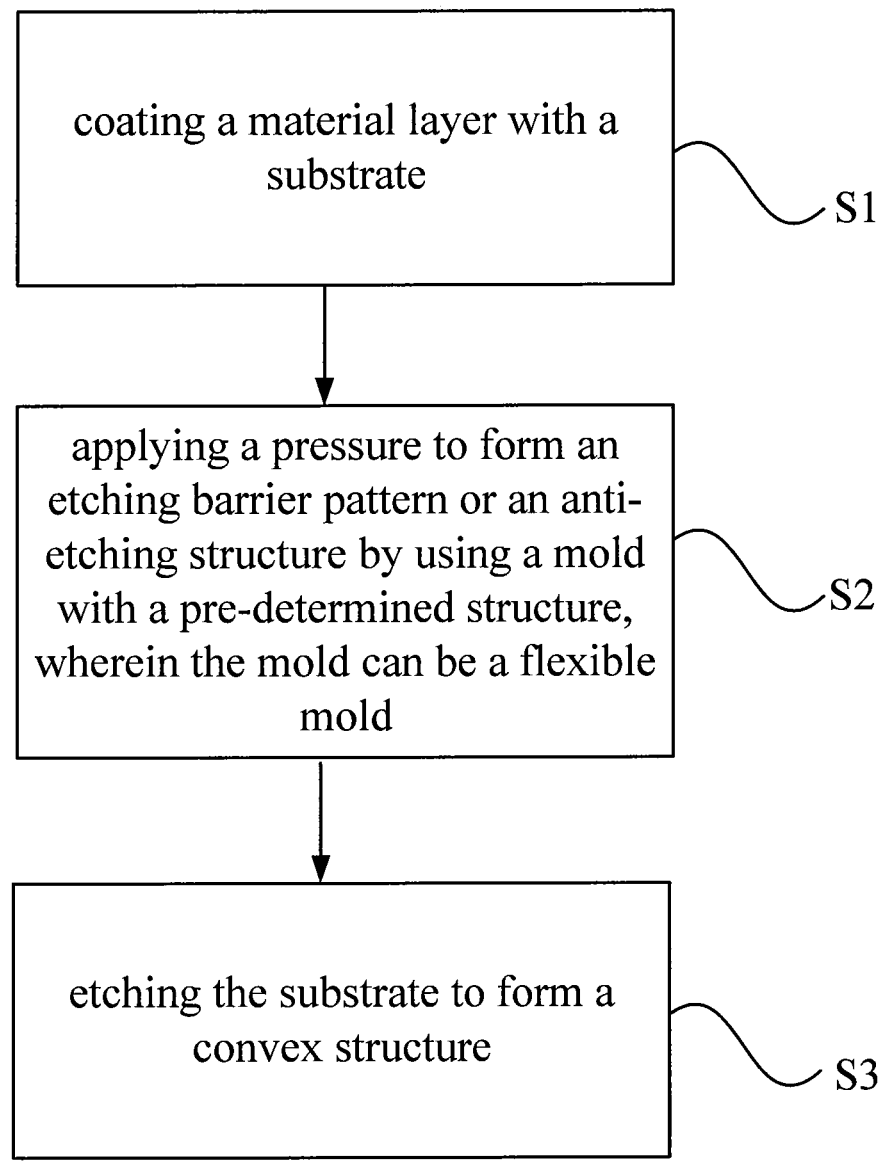
FIG. 4 illustrates a flow chart of the method for fabricating an anti-etching structure with high aspect ratio by using micro/nano imprint fabricating process according to an embodiment of the invention.

Please refer to FIG. 4. FIG. 4 illustrates a flow chart of the method for fabricating an anti-etching structure with high aspect ratio by using micro/nano imprint fabricating process according to an embodiment of the invention. As shown in FIG. 4, the method for fabricating an anti-etching structure with high aspect ratio by using micro/nano imprint fabricating process, comprising the following steps of: (S1) coating a material layer 2 on a substrate 1; (S2) applying a pressure to form an anti-etching structure 22 by using a mold 3 with a pre-determined structure 36, wherein the mold 3 can be a flexible mold and (S3) etching the substrate 1 to form a convex structure 12.

In the embodiment, the step of (S1) is coating a material layer 2 with a substrate 1. In the preferred embodiment, the material layer 2 is a silica gel. However, the material layer 2 also can be a polymer composite material which is added with carbon nanotubes or silica micro nano particles, metal or glass. Furthermore, the photoresist does not been used certainly with the polymer composite material or the material layer. In the embodiment, the substrate 1 is made of sapphire for fabricating LED. However, the substrate 1 can be made of semiconductor materials, metals, glass, or polymer composite materials.

Figure 5:
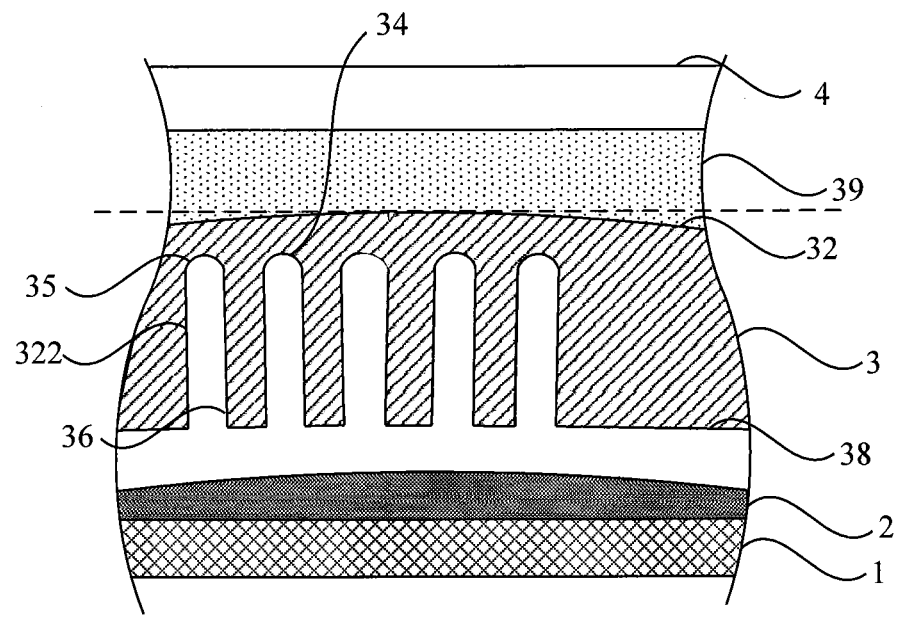
FIG. 5 illustrates a schematic diagram of imprinting before the (S2) step of the method for fabricating an anti-etching structure with high aspect ratio by using micro/nano imprint fabricating process according to an embodiment of the invention.
Figure 6:
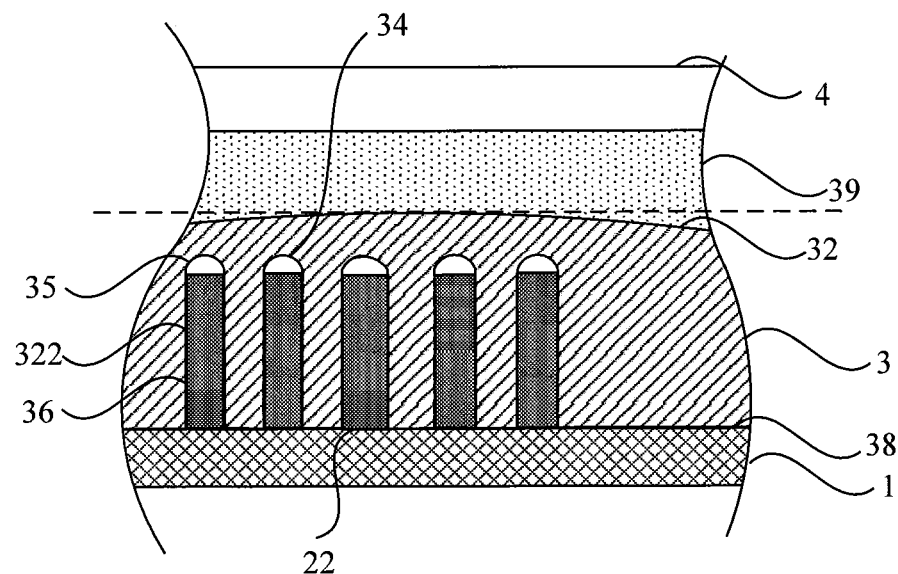
FIG. 6 illustrates a schematic diagram of imprinting after the (S2) step of the method for fabricating an anti-etching structure with high aspect ratio by using micro/nano imprint fabricating process according to an embodiment of the invention.

Please refer to FIG. 5 and FIG. 6. FIG. 5 illustrates a schematic diagram of imprinting before the (S2) step of the method for fabricating an anti-etching structure with high aspect ratio by using micro/nano imprint fabricating process according to an embodiment of the invention. FIG. 6 illustrates a schematic diagram of imprinting after the (S2) step of the method for fabricating an anti-etching structure with high aspect ratio by using micro/nano imprint fabricating process according to an embodiment of the invention. The step of (S2) is applying a pressure to form an anti-etching structure 22 by using a mold 3 with a pre-determined structure 36. The mold 3 can be a flexible mold.

Before a pressure is applied, the relative horizontal and vertical position of the substrate 1 and the mold 3 shall be corrected and fixed. Then, the substrate 1, material layer 2 and the mold 3 shall be heated up to the transition temperature (Tg) to let the material layer 2 be softened, sticky and flexible. Accordingly, when the substrate 1 or the material layer 2 are applied with a vertical pressure by the mold 3, the substrate 1 or the material layer 2 will be softened to perfuse the space defined by the pre-determined structure 36. Thus, the pre-determined structure 36 can be imprinted on the surface of the substrate 1 by the material layer 2. The ways of heating the material layer 2 are changeable, the material layer 2 can be heated by the ultrasound, beam, or by heating the substrate 1 to transmit the heat to the material layer 2. In the embodiment, the explanation of the mold 3, the overflow controlling device 38 and other element of the invention are disclosed in the previous embodiment and it will no longer be explained.

Additionally, the upper surface 32 of the mold 3 is faced to a pressing plate 4. The pressing plate 4 is connected to the power source to output the energy and drive the mold 3. When the material layer 22 is softened and the temperature is higher than the transition temperature of the material layer 22, the pressing plate 4 will drive the mold 3 with the pre-determined structure to move toward substrate 1. When the mold 3 is contacted with the material layer 2, the mold 3 will apply a pressure to the mold 3 for letting the characteristic of the pre-determined structure 36 be imprinted to the material layer 2 and form a pattern corresponded to the pre-determined structure 36. Then, the pressure shall be maintained to let the material layer 2 be formed and cooled to the appropriate temperature. Accordingly, the mold 3, the substrate 1 and the material layer 2 are separated for mold release, and then, the step of (S2) is completed.

Figure 7:
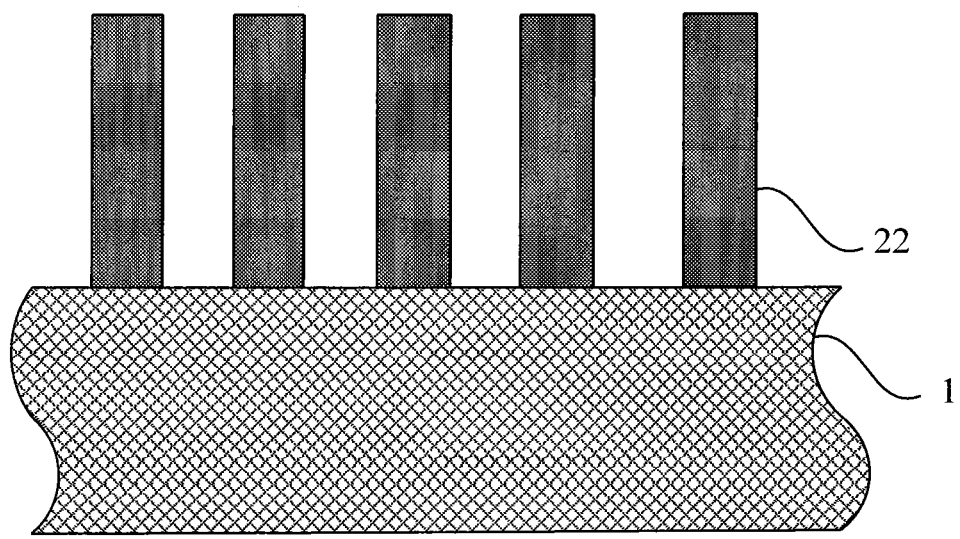
FIG. 7 illustrates a schematic diagram of the anti-etching structure before the (S3) step according to an embodiment of the invention.
Figure 8:
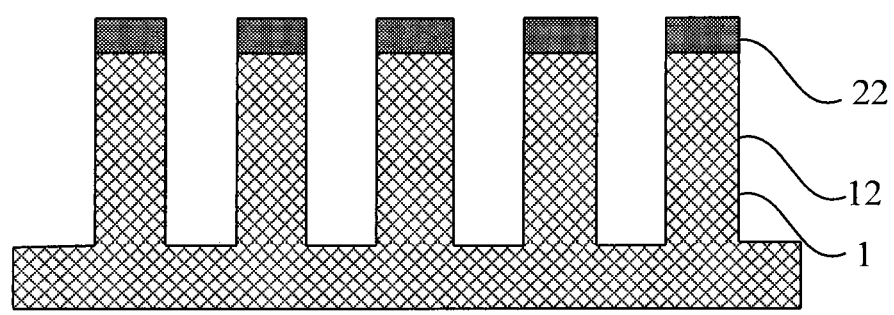
FIG. 8 illustrates a schematic diagram of the anti-etching structure after the (S3) step according to an embodiment of the invention.

Please refer to FIG. 7 and FIG. 8. FIG. 7 illustrates a schematic diagram of the anti-etching structure before the (S3) step according to an embodiment of the invention. FIG. 8 illustrates a schematic diagram of the anti-etching structure after the (S3) step according to an embodiment of the invention. The (S3) step is etching the substrate 1 to form a convex structure 12 with high aspect ratio. In the embodiment, the aspect ratio of the convex structure 12 is larger than three. That is to say, the height of the convex structure 12 is at least three times larger than the width of the convex structure 12. In the embodiment, the etching fabricating process is a dry etching fabricating process. The dry etching fabricating process is used to etch the substrate 1 by the physical bombardment of the plasma or the chemical reaction between the active radical and the atom on the board. The medium of the etching is plasma. The etching fabricating process also can be a wet etching fabricating process which lets the substrate 1 be soaked in the appropriate chemical solution or sprayed with the chemical solution. Thus, the atom of the surface of the substrate 1 can be removed and the substrate 1 will be etched. The medium of the etching is chemical solution.

In each etching fabricating process, the substrate 1 and the anti-etching structure 22 are placed in a cavity body to etch. The medium of the etching will etch and remove the substrate 1 and the anti-etching structure. The area of the substrate 1 covered by the anti-etching structure 22 will be prevented from etching by the medium of the etching. The thickness of the anti-etching structure 22 is changeable according to the different etching medium. As shown in FIG. 7 and FIG. 8, the height of the anti-etching structure 2 is obviously decreased after the fabricating process. If the low selectivity of the etching fabricating process is chosen, the anti-etching structure 22 shall be a structure with high aspect ratio to protect the substrate 1. Otherwise, if the anti-etching structure 22 is etched completely by the etching medium, the area of the substrate 1 covered with the anti-etching structure 22 will contact with the etching medium and be etched in the etching fabricating process. After the etching fabricating process, the remaining anti-etching structure 22 disposed on the convex structure 12 will be removed. In the embodiment, the area of the substrate 1 covered with the anti-etching structure 22 shall be protected. So the aspect ratio of the anti-etching structure 22 is equal to or larger than three. That is to say, the height of the anti-etching structure 22 is at least three times larger than the width of the anti-etching structure 22. The area or the full-field of the substrate 1 is more than three times larger than the minimum line width of the pattern or the structure.

To sum up, the invention does not use the lithography fabricating process, so the photoresist does not be used certainly. A material can be used if the anti-etching of the material is better than the photoresist, so that the disadvantage of the anti-etching ability can be improved in a sapphire etching process and save cost. Additionally, the invention uses a machining process, so that the resolution is not affected by the wavelength of the beam. According to the design of the invention, the structure formed on a substrate can be large scale or small scale. At the same time, the micro structure for the lateral epitaxial wafer and the micro/nano structure for anti-reflecting can be fabricated on the substrate. Furthermore, the invention is to provide a structural design micro/nano imprint mold, for controlling the distribution of the forming pressure. Additionally, the invention can improve the yield rate of the pattern fabricated with the line width under one micron in the LED fabricating process, while the flatness difference of full-field is very large. The distribution of the pressure can also be improved to increase the yield rate and the efficiency in the fabricating process.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A micro/nano imprint mold of a fabricating process, used to imprint a pattern to a substrate by a material layer, comprising:
    an upper surface and a lower surface, corresponded to each other;
    a pre-determined structure, disposed on the lower surface of the mold; and
    a pressure controlling structure, disposed at the external edge of the upper surface of the mold for increasing the thickness of the external edge of the mold, the thickness of the center portion of the mold being smaller than the peripheral of the mold;
    wherein, while a pressure is applied to the mold, the pre-determined structure of the mold is pressed onto the substrate so as to form the pattern thereon, the pattern is corresponding to the pre-determined structure and, in the pressing process, the pressure applied to the external edge of the mold is larger than the pressure applied to the center portion of the mold;
    wherein the pressure controlling structure comprises a plurality of concentric rings.

2. The micro/nano imprint mold of claim 1, wherein the pressure controlling device is disposed on the upper surface and having a gradient surface.

3. The micro/nano imprint mold of claim 1, wherein the thickness of the central portion of the pressure controlling structure is smaller than the peripheral of the pressure controlling structure.

4. The micro/nano imprint mold of claim 1, wherein the mold is a flexible mold.

5. The micro/nano imprint mold of claim 1, wherein the mold further comprises a notch structure, wherein the notch structure is disposed on the lower surface of the mold.

* * * * *